(12) United States Patent
Sun et al.

(10) Patent No.: US 11,631,705 B2
(45) Date of Patent: Apr. 18, 2023

(54) METHOD OF MANUFACTURING DISPLAY SUBSTRATE, DISPLAY SUBSTRATE AND DISPLAY PANEL

(71) Applicant: BOE TECHNOLOGY GROUP CO., LTD., Beijing (CN)

(72) Inventors: Hongda Sun, Beijing (CN); Wenjun Hou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 129 days.

(21) Appl. No.: 17/028,988

(22) Filed: Sep. 22, 2020

(65) Prior Publication Data
US 2021/0126023 A1 Apr. 29, 2021

(30) Foreign Application Priority Data

Oct. 23, 2019 (CN) .......................... 201911014118.9

(51) Int. Cl.
*H01L 27/12* (2006.01)
(52) U.S. Cl.
CPC ........ *H01L 27/1288* (2013.01); *H01L 27/124* (2013.01); *H01L 27/1262* (2013.01)
(58) Field of Classification Search
CPC ............... H01L 27/1288; H01L 27/124; H01L 27/1262
See application file for complete search history.

(56) References Cited

U.S. PATENT DOCUMENTS

| 8,633,066 B2 | 1/2014 | Lee et al. |
| 9,799,683 B2 | 10/2017 | Hou et al. |
| 2007/0020910 A1 | 1/2007 | Park et al. |
| 2011/0111599 A1* | 5/2011 | Lennon ............ H01L 21/31111 438/703 |
| 2012/0086013 A1 | 4/2012 | Lee et al. |
| 2016/0380005 A1 | 12/2016 | Hou et al. |
| 2021/0028196 A1 | 1/2021 | Wang |

FOREIGN PATENT DOCUMENTS

| CN | 102148259 A | 8/2011 |
| CN | 103996653 A | 8/2014 |
| CN | 104952887 A | 9/2015 |

(Continued)

OTHER PUBLICATIONS

"Bottom." The American Heritage(R) Dictionary of the English Language, edited by Editors of the American Heritage Dictionaries, Houghton Mifflin, 6th edition, 2016. Credo Reference, https://search.credoreference.com/content/entry/hmdictenglang/bottom/0?institutionId=743. Accessed Mar. 25, 2022. (Year: 2016).*

(Continued)

*Primary Examiner* — Peter M Albrecht
(74) *Attorney, Agent, or Firm* — Kinney & Lange, P.A.

(57) ABSTRACT

A method of manufacturing a display substrate, a display substrate and a display panel are provided. The method of manufacturing a display substrate includes: infiltrating an etching point of a film group with an etching solution, to form an infiltration groove at the etching point of a film group; and patterning a remaining part of the film group at the infiltration groove, to obtain a via hole penetrating the remaining part of the film group.

14 Claims, 6 Drawing Sheets

(56) References Cited

FOREIGN PATENT DOCUMENTS

| | | | |
|---|---|---|---|
| CN | 105742293 A | 7/2016 | |
| CN | 106531768 A | 3/2017 | |
| CN | 106711156 A | 5/2017 | |
| CN | 107507807 A | 12/2017 | |
| CN | 108231553 A | 6/2018 | |
| CN | 109659312 A | 4/2019 | |
| CN | 110349978 A | 10/2019 | |
| KR | 100367696 B1 * | 3/2003 | ....... H01L 21/76802 |
| KR | 20090070788 A * | 7/2009 | ......... H01L 21/3083 |
| TW | 329040 B | 4/1998 | |

OTHER PUBLICATIONS

First Chinese Office Action dated Jul. 2, 2021, received for corresponding Chinese Application No. 201911014118.9, 14 pages.

* cited by examiner

METHOD OF MANUFACTURING DISPLAY SUBSTRATE, DISPLAY SUBSTRATE AND DISPLAY PANEL

CROSS-REFERENCE TO RELATED APPLICATION

This application claims priority to Chinese Patent Application No. 201911014118.9 filed on Oct. 23, 2019 in China National Intellectual Property Administration, the disclosure of which is incorporated herein by reference in entirety.

TECHNICAL FIELD

The present disclosure relates to the field of display technology, and in particular, to a method of manufacturing a display substrate, a display substrate and a display panel.

BACKGROUND

In the display substrate of the liquid crystal display in related art, usually the control lines or power supply lines of the thin film transistor are separated by a film group structure, and then the control lines or power supply lines located in different film layers are connected through via holes opened in some of the film layers of the display substrate and conductive film layers provided in the via holes, to obtain the driving of pixels. The film group here means a film layer group including at least one film layer. With the development of display technology towards ultra-high resolution, the size of the via holes in the display substrate is getting smaller and smaller, causing problems such as difficulty in etching or low etching accuracy during the preparation of the via holes.

SUMMARY

According to an aspect of the present disclosure, there is provided a method of manufacturing a display substrate, the method comprising:
infiltrating an etching point of a film group with an etching solution, to form an infiltration groove at the etching point of a film group; and
patterning a remaining part of the film group at the infiltration groove, to obtain a via hole penetrating the remaining part of the film group.

In some embodiments, infiltrating an etching point of a film group with an etching solution, comprises:
fixed-point placing, by using a printing method, the etching solution at the etching point.

In some embodiments, an inner surface of the infiltration groove is a curved surface, and an opening size of the infiltration groove is larger than an opening size of the via hole patterned at a bottom of the infiltration groove.

In some embodiments, the etching solution comprises: hydrofluoric acid with a concentration of not more than 5%.

In some embodiments, patterning a remaining part of the film group at the infiltration groove, comprises:
providing a photoresist layer on the film group, and making the photoresist layer to form an opening in the infiltration groove, a size of the opening corresponding to an opening size of the via hole to be etched at a bottom of the infiltration groove;
dry etching the film group, to obtain the via hole penetrating the remaining part of the film group; and
stripping the remaining photoresist layer.

In some embodiments, the film group comprises a first film layer and a second film layer which are stacked;
the method comprises:
infiltrating the etching point of the film group with the etching solution, to form the infiltration groove on a side of the first film layer away from the second film layer; and
patterning the remaining part of the film group at the infiltration groove, to obtain the via hole penetrating the remaining part of the film group.

In some embodiments, patterning the remaining part of the film group at the infiltration groove, comprises:
providing a first photoresist layer on the first film layer, and making the first photoresist layer to form a first opening in the infiltration groove, a size of the first opening corresponding to an opening size of a first via hole to be etched at a bottom of the infiltration groove;
implementing a first dry etching, by using the first photoresist layer as a mask, on the first film layer, to obtain the first via hole penetrating the first film layer;
stripping the remaining first photoresist layer;
providing a second photoresist layer on the first film layer and a portion of the second film layer exposed in the first via hole, and making the second photoresist layer to form a second opening in the first via hole, a size of the second opening corresponding to an opening size of a second via hole to be etched at a side close to the first film layer;
implementing a second dry etching, by using the second photoresist layer as a mask, on the second film layer, to obtain the second via hole penetrating the second film layer; and
stripping the remaining second photoresist layer.

In some embodiments, an orthographic projection of the first via hole on the display substrate and an orthographic projection of the second via hole on the display substrate overlap each other; or
an orthographic projection of the infiltration groove on the display substrate and an orthographic projection of the first via hole on the display substrate overlap each other.

In some embodiments, the orthographic projection of the first via hole on the display substrate covers the orthographic projection of the second via hole on the display substrate; or
the orthographic projection of the infiltration groove on the display substrate covers the orthographic projection of the first via hole on the display substrate.

In some embodiments, the patterning process comprises a photolithography process and a dry etching process.

According to another aspect of the present disclosure, there is provided a display substrate manufactured according to the above mentioned method, the display substrate comprising:
the film group;
the infiltration groove provided on a side of the film group;
the via hole provided at the infiltration groove of the film group, wherein the via hole penetrates the film group, one end opening of the via hole is located at a bottom of the infiltration groove, and the other end opening of the via hole is located at a side of the film group away from the infiltration groove.

In some embodiments, the display substrate further comprises a first conductor layer located at a side of the film group away from the infiltration groove, and a second conductor layer located at a side of the film group close to the infiltration groove, the first conductor layer and the second conductor layer are connected through the via hole.

In some embodiments, the film group comprises a first film layer and a second film layer which are stacked;

the via hole comprises a first via hole and a second via hole those are communicated with each other;

the infiltration groove is located on a side of the first film layer away from the second film layer, and the first via hole is located at the infiltration groove and penetrates the first film layer along a direction of the bottom of the infiltration groove towards the second film layer; and the second film layer has the second via hole, and the second via hole penetrates the second film layer.

In some embodiments, an orthographic projection of the first via hole on the display substrate and an orthographic projection of the second via hole on the display substrate overlap each other; or an orthographic projection of the infiltration groove on the display substrate and an orthographic projection of the first via hole on the display substrate overlap each other.

In some embodiments, the orthographic projection of the first via hole on the display substrate covers the orthographic projection of the second via hole on the display substrate; or the orthographic projection of the infiltration groove on the display substrate covers the orthographic projection of the first via hole on the display substrate.

In some embodiments, an inner surface of the infiltration groove is a curved surface, and an opening size of the infiltration groove is greater than an opening size of the first via hole at a bottom of the infiltration groove.

In some embodiments, the second film layer is a buffer layer, and the first film layer is an isolation layer.

According to yet another aspect of the present disclosure, there is provided a display panel, comprising the display substrate mentioned above.

BRIEF DESCRIPTION OF THE DRAWINGS

The above and/or additional aspects and advantages of the present disclosure will become obvious and easy to understand from the following description of the embodiments in conjunction with the accompanying drawings, in which.

DETAILED DESCRIPTION OF EMBODIMENTS

The present disclosure will be described in detail below. Examples of embodiments of the present disclosure are shown in the accompanying drawings, wherein the same or similar reference numerals indicate the same or similar components or components with the same or similar functions. In addition, if a detailed description of the known technology is unnecessary for the illustrated feature of the present disclosure, it will be omitted. The embodiments described below with reference to the drawings are exemplary, and are only used to explain the present disclosure, and cannot be construed as limiting the present disclosure.

Those skilled in the art can understand that, unless otherwise defined, all terms (including technical terms and scientific terms) used herein have the same meanings as those commonly understood by those of ordinary skill in the art to which the present disclosure belongs. It should also be understood that terms such as those defined in general dictionaries should be understood to have a meaning consistent with the meaning in the context of the relevant technology, and unless specifically defined as here, they will not be interpreted in idealized or overly formal meanings.

Those skilled in the art can understand that, unless specifically stated, the singular forms "a", "an", "said" and "the" used herein may also include plural forms. It should be further understood that the term "comprise" used in the specification of the present disclosure refers to the presence of the described features, integers, steps, operations, elements and/or components, but does not exclude the presence or addition of one or more other features, integers, steps, operations, elements, components, and/or groups thereof. It should be understood that when we refer to an element as being "connected" or "coupled" to another element, it can be directly connected or coupled to the other element, or intervening elements may also be present. In addition, "connected" or "coupled" used herein may include wireless connection or wireless coupling. The term "and/or" as used herein includes all or any unit and all combinations of one or more associated listed items.

Figure 1:
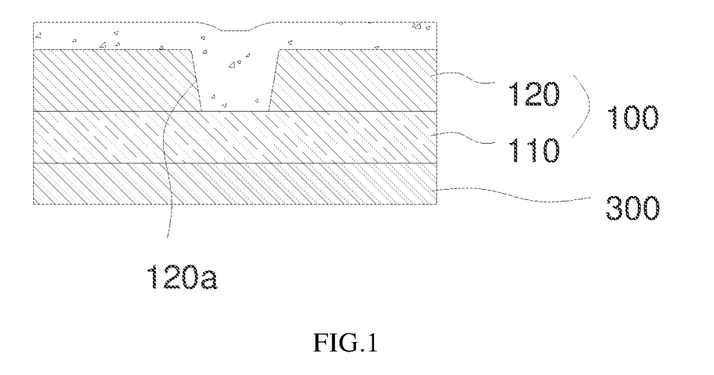
FIG. 1 is a structural diagram of a display substrate prepared for a second dry etching after the first dry etching is completed in the related art.
Figure 2:
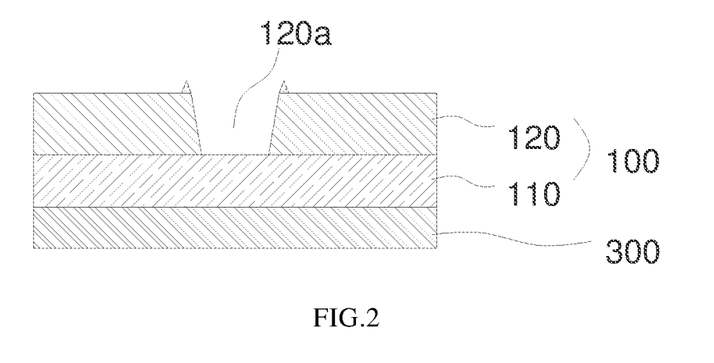
FIG. 2 is a schematic diagram of forming a denatured photoresist at the opening of the via hole after the first dry etching is completed in the related art.
Figure 3:
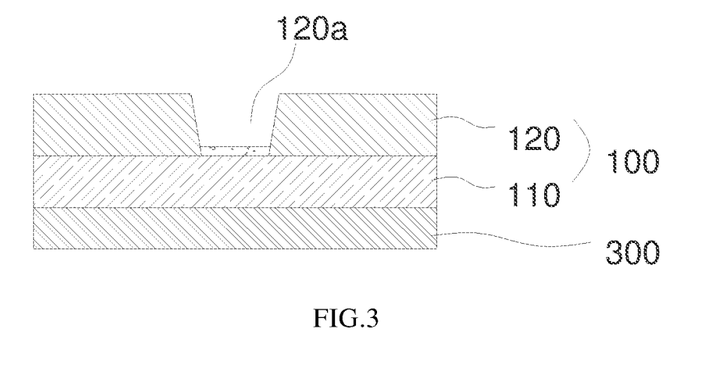
FIG. 3 is a schematic diagram of the remaining photoresist formed on the bottom of the via hole after the first dry etching is completed in the related art.
Figure 4:
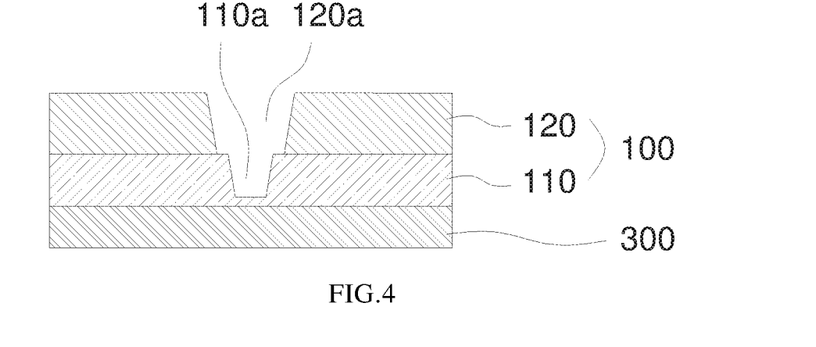
FIG. 4 is a schematic diagram of the second dry etching unable to etch through the relevant film layer due to photoresist residue in the related art.

The inventors of the present disclosure have conducted research and found that in order to achieve ultra-high resolution, the size of the via hole on the display substrate is getting smaller and smaller, and the line width and line spacing of the conductive film layer are also smaller. The electrical requirements of this will increase the thickness of the conductive film layer, and in order to avoid short circuits between layers, the thickness of the inorganic dielectric layer between the conductive film layers can only be increased correspondingly. An excessively thick inorganic dielectric layer brings about problems of large via hole etching, difficult etching, or low etching accuracy. In some embodiments, the display substrate may be an array substrate. The examples of the display substrates in some drawings of this embodiment are all array substrates. As shown in FIG. 1 and FIG. 2, the use of related techniques for etching, as the amount of dry etching increases, more denatured photoresist layers are easily formed, which adhere to the periphery of the via hole, resulting in defects including subsequent interlayer disconnection, etc.; as shown in FIG. 3 and FIG. 4, due to the large via hole depth, after the upper via hole is completed, when the lower via hole is patterned, photoresist will remain in the hole, resulting in the lower via hole not being completely etched, thereby producing residue.

The photoresist denaturation is caused by the etching of the etching gas on the photoresist during the etching process. There are two reasons for the photoresist denaturation: one is the thickness of the photoresist, and the other is the film to be etched. When the layer thickness is thick, the etching time is longer, which increases the etching time of the etching gas on the photoresist, so it is easy to denature the photoresist.

The method of manufacturing a display substrate, the display substrate, and the display panel provided by the present disclosure are intended to solve the above technical problems of related art.

The technical solutions of the present disclosure and how the technical solutions of the present disclosure solve the above technical problems will be described in detail below with specific embodiments.

Figure 5:
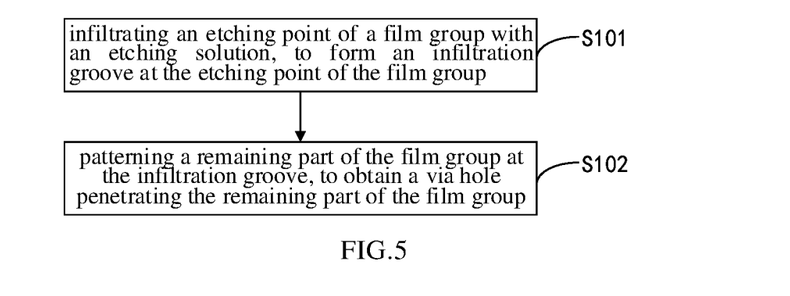
FIG. 5 is a schematic flowchart of an implementation of a method for manufacturing a display substrate according to an embodiment of the present disclosure.

The embodiment of the present disclosure provides a method of manufacturing a display substrate. The schematic flow chart of the manufacturing method is shown in FIG. 5 and includes the following steps of:

S101: infiltrating an etching point of a film group with an etching solution, to form an infiltration groove at the etching point of the film group; and S102: patterning a remaining part of the film group at the infiltration groove, to obtain a via hole penetrating the remaining part of the film group.

The film group 100 is an insulating film layer structure between two conductive layers. Optionally, the film group 100 may be an insulating film layer structure located between the conductive region (including the gate region, the source region or the drain region) of the thin film transistor and the conductive film layer outside the thin film transistor in the display substrate. Optionally, the film group 100 may be an insulating film layer structure between two conductive layers in the display substrate.

Figure 9:
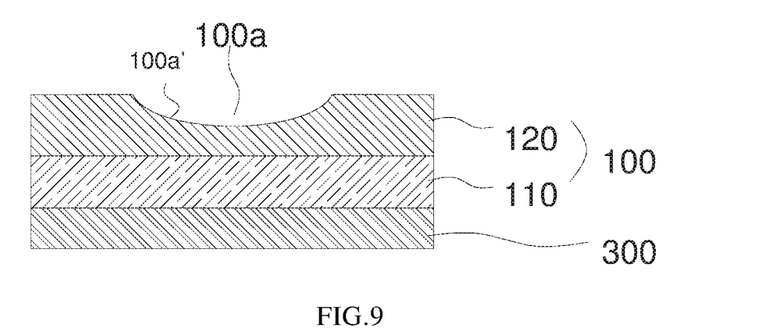
FIG. 9 is a schematic structural diagram of infiltrating an etching point of a film group with an etching solution to form an infiltration groove at the etching point of the film group, provided by another embodiment of the present disclosure.

The thickness of the photoresist in the traditional process is usually between 1.0 and 1.5 microns. In the embodiment of the present disclosure, before the via hole is patterned, the etching solution is used to infiltrate the etching point of the film group 100 to form an infiltration groove 100a at the etching point of the film group 100. The structure of the obtained display substrate is shown in FIG. 9. According to the amount of etching solution, the infiltration groove 100a is formed to be in a depth of, for example, 0.3~1.0 microns, which reduces the thickness of the film group 100 to be etched by 0.3~1.0 microns, and the thickness of the photoresist layer for subsequent patterning can also be reduced by 0.3~1.0 microns.

In this embodiment, by the corrosion of the etching solution, the thickness of the film to be etched is reduced, the etching time is shortened, and the thickness of the photoresist layer can be reduced, so it effectively avoids the occurrence of photoresist denaturation, greatly reduces the probability of denaturation of the photoresist layer at the edge of the via hole, reduces the risk of short circuit between layers of the film group 100, improves the etching accuracy, and helps improving the ability to reduce the aperture. In addition, the etching solution only performs infiltration corrosion on the etching point corresponding to the via hole, and most of the remaining film group 100 is not infiltrated, which does not affect the overall electrical characteristics such as capacitance. Wherein, the step S102 of patterning a remaining part of the film group at the infiltration groove to obtain a via hole penetrating the remaining part of the film group will be described in detail later, and will not be repeated here.

Optionally, the patterning process includes photolithography process and dry etching process.

Optionally, the film group 100 may be an inorganic dielectric layer.

The inventor of the present disclosure considers that there are a large number of via holes that need to be etched on the display substrate, and correspondingly the etching solution has a large number of infiltration points, so it is necessary to provide an efficient or accurate delivery method to meet production needs. For this reason, the present disclosure provides the following possible implementation for the manufacturing method.

In the embodiment of the present disclosure, infiltrating the etching point of the film group with the etching solution includes: fixed-point placing, by using a printing method, the etching solution at the etching point.

Optionally, existing printing equipment, such as printing EL (luminescent layer) equipment or printing ink equipment, is used, and the storage cavity and pipeline material of the printing equipment are configured to adapt to the physical and chemical characteristics of the corresponding etching solution, just like printing EL equipment, The spraying amount can be adjusted according to the demand, generally speaking, it is at the ul level. The existing printing equipment can achieve automatic alignment. When making the display substrate, the MARK (mark) is marked in the corner, usually a cross type. The printing equipment has a camera to capture and extract the MARK. The alignment accuracy is basically about 3 μm (microns).

The inventor of the present disclosure considers that the shape of the infiltration groove 100a needs to be designed to facilitate subsequent patterning of via holes. To this end, the present disclosure provides the following possible implementation for the manufacturing method.

Figure 11:
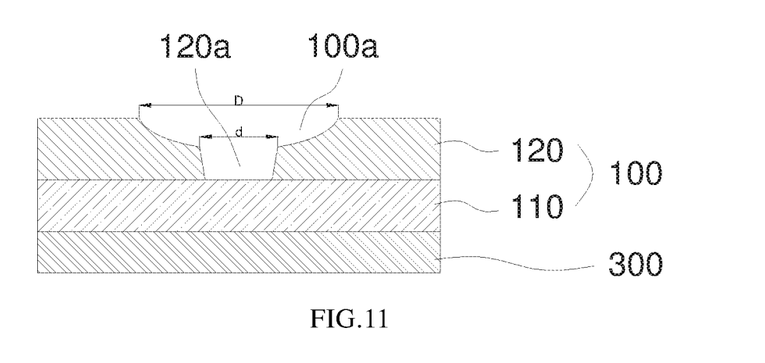
FIG. 11 is a schematic structural diagram of implementing a first drying etching, by using the first photoresist layer as a mask, on the first film layer, to obtain the first via hole penetrating the first film layer, provided by another embodiment of the present disclosure.

As shown in FIG. 11, the inner surface 100a' of the infiltration groove in the embodiment of the present disclosure is a curved surface, which may specifically be a part of a spherical surface. The opening size D of the infiltration groove is larger than the opening size d of the via hole formed by patterning at the bottom of the infiltration groove. Here the opening size represents the maximum size of the opening. For example, when the opening is circular, the opening size represents the diameter of the opening.

A spherical cap-shaped infiltration groove 100a is formed on the surface of the film group 100, and a gentle slope is formed at the opening of the via hole formed by subsequent patterning, which forms a favorable morphology for the coating of the photoresist layer and reduces the possibility of photoresist layer residue.

The inventor of the present disclosure considers that it is necessary to select a suitable etching solution to form an infiltration groove 100a on the surface of the film group 100 by infiltration. To this end, the present disclosure provides the following possible implementation for the manufacturing method.

The etching solution comprises: hydrofluoric acid with a concentration of not more than 5%.

The etching solution uses hydrofluoric acid, and the concentration of hydrofluoric acid is about 5% to achieve corrosion. Micro-spraying can be used, that is, a small amount of hydrofluoric acid is fixed-point placed at the location where holes are needed. Due to the small amount of hydrofluoric acid, it does not have the elution ability, and pitting corrosion is formed on the surface of the film group 100. Moreover, the part of the film that has been corroded by hydrofluoric acid is loose, and in subsequent patterning, it is easier to be etched than the part of the film group 100 that has not been corroded by hydrofluoric acid.

Optionally, the printing equipment used for printing hydrofluoric acid can be adapted to certain extent, and the printing fluid storage cavity and pipeline material of the printing equipment can be made of hydrofluoric acid corrosion-resistant materials, such as Teflon, which can effectively reduce Hydrofluoric acid damage.

Figure 6:
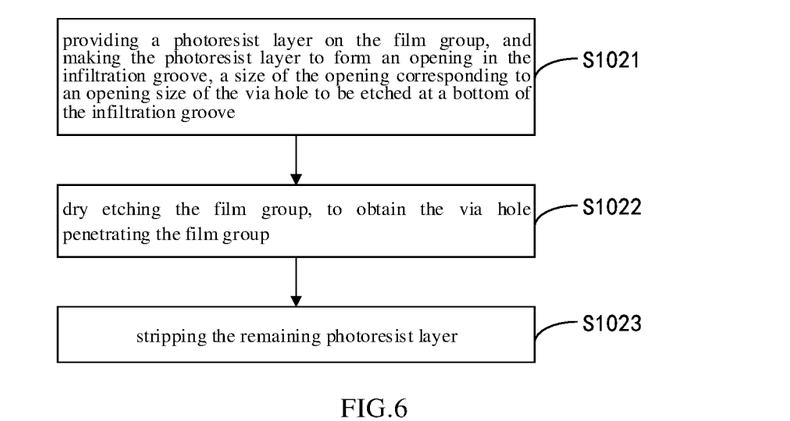
FIG. 6 is a schematic flowchart of a specific method of step S102 in FIG. 5.

The abovementioned step S102 of patterning a remaining part of the film group 100 at the infiltration groove 100a to obtain a via hole penetrating the remaining part of the film group, as shown in the flowchart of FIG. 6, may include the following steps.

S1021: providing a photoresist layer on the film group, and making the photoresist layer to form an opening in the infiltration groove, a size of the opening corresponding to an opening size of the via hole to be etched at a bottom of the infiltration groove.

Optionally, considering the CDloss (Critical Dimension loss) of the etching process, the pattern of the photoresist layer cannot be 100% transferred to the film group to be etched, but there will be a certain size loss. The size of the pattern of the film group which is actually transferred is often slightly smaller than the size of the pattern of the photoresist layer. The size deviation between the graphic of the film group and the graphic of the photoresist layer can be obtained in advance based on experimental data, empirical data and/or operational data.

The so-called expression that the size of the opening corresponds to the opening size of the via hole to be etched at the bottom of the infiltration groove, means that, according to the size of the via hole to be etched (such as diameter) and the known deviation of the above-mentioned size, the pattern of the photoresist layer with matching size (such as exposed area) is reserved to improve the etching accuracy.

S1022: dry etching the film group, to obtain the via hole penetrating the remaining part of the film group.

S1023: stripping the remaining photoresist layer.

Since a gentle slope is formed at the infiltration groove 100a of the film group 100, the thickness of the film group 100 that needs to be etched is reduced, and the thickness of the photoresist layer can be reduced, which greatly reduces the probability of degeneration of the photoresist layer at the edge of the via hole. The photoresist layer forms an opening in the infiltration groove 100a, and the size of the opening can be adjusted adaptively according to the size of the via hole to be etched. After the film group 100 undergoes dry etching, the required via hole is obtained, and then the remaining photoresist layer is stripped to prepare for other subsequent processes.

The embodiment of the present disclosure also provides an extended method for manufacturing a display substrate. The film group includes a second film layer and a first film layer which are stacked. As shown in the schematic flow chart of FIG. 7, the method includes the following steps.

Figure 7:
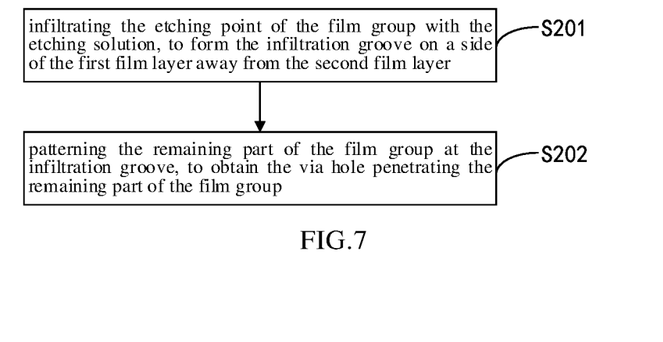
FIG. 7 is a schematic flowchart of another implementation of a method for manufacturing a display substrate according to an embodiment of the present disclosure.

S201: infiltrating the etching point of the film group with the etching solution, to form the infiltration groove on a side of the first film layer away from the second film layer.

In this step, the second film layer 110 may be a buffer layer, and the first film layer 120 may be an isolation layer. After performing the step S201, the display substrate structure shown in FIG. 9 is obtained, and the infiltration groove 100a is formed on the side of the first film layer 120 away from the second film layer 110.

S202: patterning the remaining part of the film group at the infiltration groove, to obtain the via hole penetrating the remaining part of the film group.

In this embodiment, optionally, the etching solution is infiltrated into the etching point of the first film layer 120, and the etching point is located on the side of the first film layer 120 away from the second film layer 110. That is, setting the etching point on the surface of the first film layer 120 away from the second film layer 110, on the one hand, facilitates the etching solution printing and wetting, and on the other hand, is beneficial to control the formation of the infiltration groove 100a on the first film layer 120 away from the second film layer 110. It is ensured that the side of the first film layer 120 close to the second film layer 110 has a sufficient dense film structure, thereby ensuring that the structure of the film group 100 of the display substrate is intact.

Figure 8:
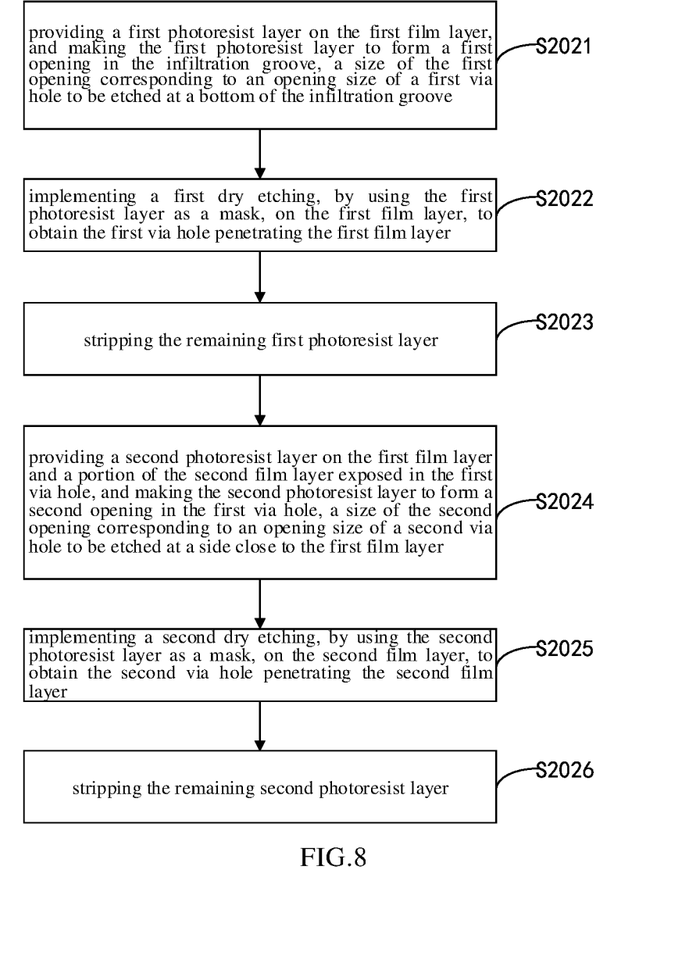
FIG. 8 is a schematic flowchart of a specific method of step S202 in FIG. 7.

The abovementioned S202 of patterning the remaining part of the film group at the infiltration groove to obtain the via hole penetrating the remaining part of the film group, as shown in the flowchart of FIG. 8, may include the following steps.

S2021: providing a first photoresist layer on the first film layer, and making the first photoresist layer to form a first opening in the infiltration groove, a size of the first opening corresponding to an opening size of a first via hole to be etched at a bottom of the infiltration groove.

Figure 10:
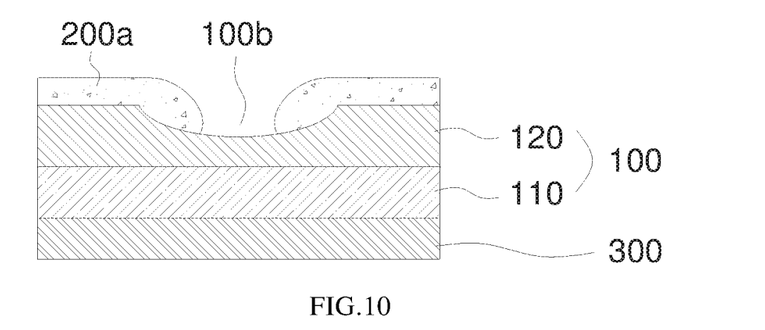
FIG. 10 is a schematic structural diagram of providing a first photoresist layer on the first film layer and making the first photoresist layer to form a first opening in the infiltration groove, provided by another embodiment of the present disclosure.

After this step, the display substrate structure shown in FIG. 10 is obtained. The first photoresist layer 200a is placed on the side of the infiltration groove 100a of the first film layer 120, and a first opening 100b is formed in the infiltration groove 100a.

S2022: implementing a first dry etching, by using the first photoresist layer as a mask, on the first film layer, to obtain the first via hole penetrating the first film layer.

S2023: stripping the remaining first photoresist layer.

After steps S2022 and S2023, the display substrate structure as shown in FIG. 11 is obtained. The first via hole 120a is in the infiltration groove 100a of the first film layer 120 and penetrates the first film layer 120.

S2024: providing a second photoresist layer on the first film layer and a portion of the second film layer exposed in the first via hole, and making the second photoresist layer to form a second opening in the first via hole, a size of the second opening corresponding to an opening size of a second via hole to be etched at a side close to the first film layer.

Figure 12:
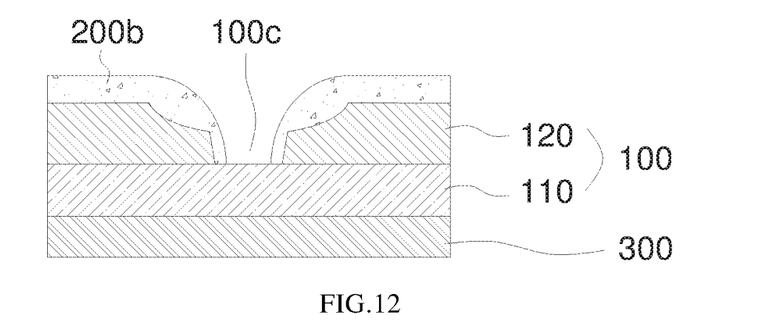
FIG. 12 is a schematic structural diagram of providing a second photoresist layer on the first film layer and a portion of the second film layer exposed in the first via hole, provided by another embodiment of the present disclosure.

After this step, the display substrate structure shown in FIG. 12 is obtained. The second photoresist layer 200b is placed on the side of the first film layer 120 with the infiltration groove 100a, and a second opening 100c is formed in the first via hole 120a.

S2025: implementing a second dry etching, by using the second photoresist layer as a mask, on the second film layer, to obtain the second via hole penetrating the second film layer.

S2026: stripping the remaining second photoresist layer.

Figure 13:
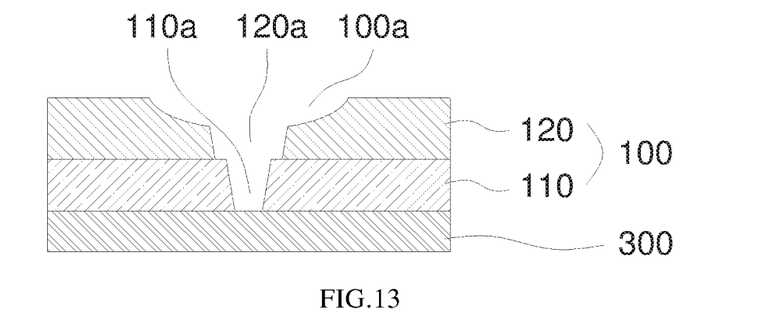
FIG. 13 is a schematic structural diagram of implementing a second drying etching, by using the second photoresist layer as a mask, on the second film layer, to obtain the second via hole penetrating the second film layer, provided by another embodiment of the present disclosure.

After steps S2025 and S2026, the display substrate structure as shown in FIG. 13 is obtained. The second via hole 110a penetrates the second film layer 110 and is connected to the first via hole 120a of the first film layer 120.

In steps S2021-S2026, two dry etchings are implemented, the first film layer 120 is etched to obtain the first via hole 120a, and the second film layer 110 is etched to obtain the second via hole 110a, which reduces the amount of dry etching each time. That is, the thickness of the photoresist layer required for each dry etching is reduced, which can effectively reduce the probability of degeneration of the photoresist layer at the edge of the via hole. Moreover, each dry etching will undergo a stripping process to remove the remaining photoresist layer in time, which can also reduce the probability of denaturation of the photoresist layer at the edge of the via hole and improve the etching accuracy.

Both the first film layer 120 and the second film layer 110 can be made of SiOx material, $0<x\leq2$. The etching conditions of the first via hole 120a and the second via hole 110a can be dry etching of $CF_4+O_2$.

Optionally, an axis of the first via hole coincides with an axis of the second via hole, and/or, a minimum aperture of the first via hole is not less than a maximum aperture of the second via hole. Optionally, the aperture of the first via hole 120a may be slightly larger than the aperture of the second via hole 110a, so that the second photoresist layer 200b is reserved for dry etching of the second via hole 110a.

It can be understood that when the film group 100 of the display substrate further has a third film layer, a fourth film layer or more, the above solution can be adopted to increase the number of dry etchings correspondingly; or, when the film group 100 of the display substrate has only one film layer, or when one of the layers is relatively thicker, the above-mentioned multiple dry etching method can also be used to etch the relatively thicker layer multiple times, which can effectively reduce the probability of photoresist layer degeneration at the edge of the via hole.

Figure 14:
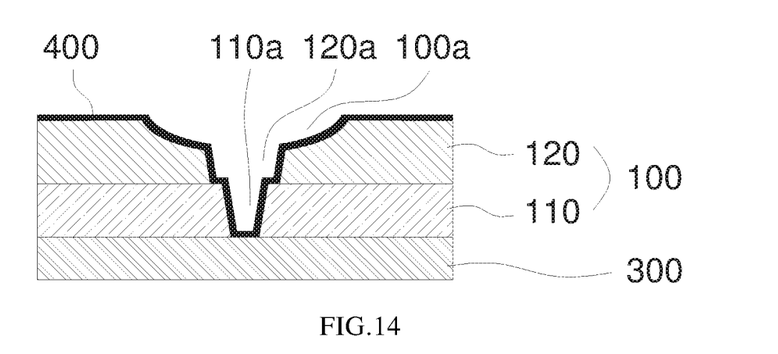
FIG. 14 is a schematic structural diagram of a display substrate obtained by laying a second conductor layer on the first film layer, on the second film layer in the first via hole, and on the substrate in the second via hole, according to an embodiment of the present disclosure.

Optionally, as shown in FIG. 14, a second conductor layer 400 is placed on the first film layer 120, on the second film layer 110 in the first via hole 120a, and in the second via hole 110a. The second conductor layer 400 is connected to the first conductor layer 300 on the side of the film group 100 away from the infiltration groove 100a through a via hole.

The display substrate with the aforementioned via hole structure manufactured by the method provided in this embodiment is compared with the wiring method of deepening small holes in the related art, and the overlapping of the first conductor layer 300 with other subsequent conductive layers (such as the second conductor layer 400) will be easier. On the other hand, the function of the via hole is to electrically connect other subsequent conductive layers with the first conductor layer 300 under the via hole. The via hole of the present solution forms a stepped structure, which makes the slope relatively gentle, which is beneficial to the connection of other conductive layers and the first conductor layer 300 under the via hole, and reduces the risk of disconnection on the sidewall of the via hole.

Based on the same inventive concept, the embodiments of the present disclosure provide a display substrate manufactured by the manufacturing method provided by any of the above embodiments. The structure of the display substrate is shown in FIG. 13, and the display substrate includes:

a film group 100;

an infiltration groove 100a provided on a side of the film group 100;

a via hole provided at the infiltration groove 100a of the film group, wherein the via hole penetrates the film group, one end opening of the via hole is located at a bottom of the infiltration groove 100a, and the other end opening of the via hole is located at a side of the film group 100 away from the infiltration groove 100a.

The infiltration groove 100a formed on one side of the film group 100 of the display substrate reduces the thickness of the film group 100 to be etched, reduces the amount of etching, and helps reduce the thickness of the photoresist layer used to form the via hole for subsequent patterning, and greatly reduces the probability of denaturation of the photoresist layer at the edge of the via hole, reduces the risk of short-circuit between layers of the film group 100, improves the accuracy of the via hole obtained, and helps to reduce the aperture of the via hole. In addition, the film group 100 of the display substrate only has an infiltration groove 100a at the via hole, and most of the remaining film group 100 is not infiltrated, which does not affect the overall electrical characteristics such as capacitance of the film group 100.

Optionally, as shown in FIG. 14, the display substrate also includes a first conductor layer 300 located at the side of the film group 100 away from the infiltration groove 100a, and a second conductor layer 400 located at the side of the film group close to the infiltration groove. The first conductor layer 300 and the second conductor layer 400 are connected through the via hole. The via hole of this solution forms a stepped structure, which makes the slope relatively gentle, is beneficial to the connection of other conductive layers and the first conductor layer 300 under the via hole, and reduces the risk of disconnection on the sidewall of the via hole. Optionally, if the first conductor layer 400 is made of a metal material such as aluminum, steel, tungsten, or titanium, or an opaque doped conductive semiconductor material, the first conductor layer 400 has a light-shielding function, that is, the first conductor layer 400 is also a light-shielding layer in this case.

The inventor of the present disclosure considers that the film group 100 of the display substrate is often a multilayer structure. As the number of film layers increases, the thickness of the film group 100 will also increase. This will increase the adaptability of the photoresist layer. Increase the probability of denaturation of the photoresist layer at the edge of the via hole and affect the accuracy of the via hole on the display substrate. To this end, the present disclosure provides the following possible implementation for a display substrate.

As shown in FIG. 13, the film group 100 comprises a first film layer 110 and a second film layer 120 which are stacked; the via hole comprises a first via hole 120a and a second via hole 110a those are communicated with each other; the infiltration groove 100a is located on a side of the first film layer 120 away from the second film layer 110, and the first via hole 120a is located at the infiltration groove 100a and penetrates the first film layer 120 along a direction of the bottom of the infiltration groove 100a towards the second film layer 110; and the second film layer 110 has the second via hole 110a, and the second via hole 110a penetrates the second film layer 110.

The via hole on the display substrate is separated into two those are communicated with each other, namely the first via hole 120a that penetrates the first film layer 120 and the second via hole 110a that penetrates the second film layer 110, which facilitates the etching process of the via hole to be divided into two implementations, reducing the amount of each dry etching, that is, reducing the thickness of the photoresist layer required for each dry etching, thereby effectively reducing the probability of degeneration of the photoresist layer at the edge of the via hole and improving the etching accuracy of the via hole.

The inventor of the present disclosure considers that in the case where the film group 100 has two layers, a reasonable positional relationship between the two via holes is beneficial to reduce the difficulty of the etching process and also helps to improve the etching accuracy of the via hole. To this end, the present disclosure provides the following possible implementation for a display substrate.

In some embodiments, an orthographic projection of the first via hole 120a on the display substrate and an orthographic projection of the second via hole 110a on the display substrate overlap each other; or an orthographic projection of the infiltration groove 100a on the display substrate and an orthographic projection of the first via hole 120a on the display substrate overlap each other.

In some embodiments, the orthographic projection of the first via hole 120a on the display substrate covers the orthographic projection of the second via hole 110a on the display substrate; or the orthographic projection of the infiltration groove 100a on the display substrate covers the orthographic projection of the first via hole 120a on the display substrate.

As shown in FIG. 13, the first via hole 120a and the second via hole 110a are coaxially arranged; what needs to be explained here is that the coaxial arrangement is not strictly coaxial, but also contains process errors. This is because there are inevitably errors in the mask when making the via hole twice.

Or, a central axis of the infiltration groove 100a is coaxially arranged with the first via hole 120a and the second via hole 110a.

The first via hole 120a and the second via hole 110a are coaxially arranged, which can simplify the coating of the second photoresist layer 200b when etching the second via hole 110a, reduce the difficulty of the second dry etching process, and improve the etching accuracy of the second via hole 110a.

The central axis of the infiltration groove 100a is coaxially arranged with the first via hole 120a and the second via hole 110a. It can also simplify the coating of the first photoresist layer 200a when etching the first via hole 120a, reduce the difficulty of the first dry etching process, and is also beneficial to improve the etching accuracy of the first via hole 120a.

Optionally, the infiltration groove 100a has a spherical crown shape, and the opening size of the infiltration groove 100a is larger than the opening size of the first via hole 120a at the bottom of the infiltration groove 100a. The opening of the first via hole 120a on the first film layer 120 has a sufficiently gentle slope, which is beneficial to the connection of other conductive layers and the first conductor layer 300 under the via hole, and reduces the risk of disconnection of the sidewall of the via hole.

Optionally, the minimum aperture of the first via hole 120a is not less than the maximum aperture of the second via hole 110a. Further, the aperture of the first via hole 120a may be slightly larger than the aperture of the second via hole 110a, and the accommodating space of the second photoresist layer 200b is reserved for dry etching of the second via hole 110a.

Figure 15:
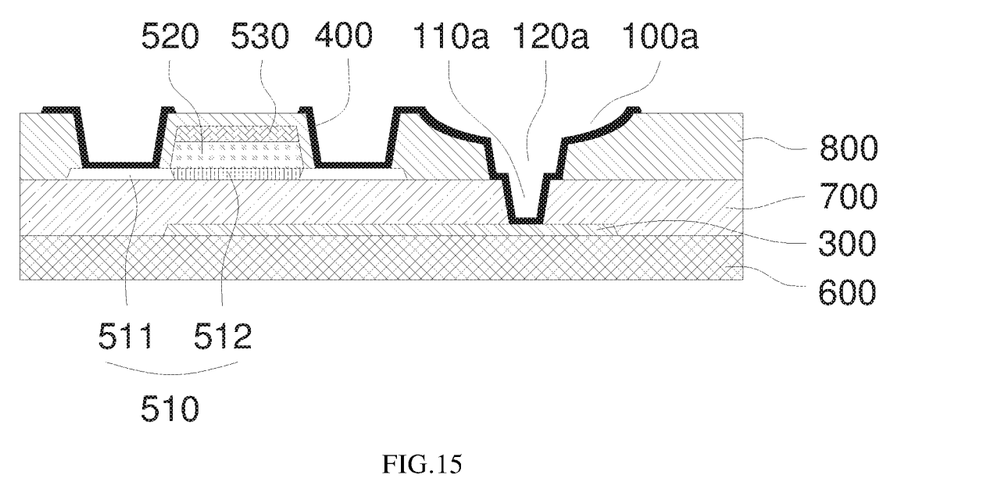
FIG. 15 is a schematic structural diagram of an example of a display substrate according to an embodiment of the present disclosure.

FIG. 15 is an example of a display substrate manufactured by using an extended method of manufacturing a display substrate provided by an embodiment of the present disclosure. The display substrate includes: a glass substrate 600, a first conductor layer 300, a buffer layer 700, an active layer 510, a gate insulating layer 520, the gate layer 530, an interlayer dielectric layer 800 and a second conductor layer 400 and so on. Optionally, the second conductor layer 400 may be a source-drain layer; the active layer 510 includes a first region 511 and a second region 512, the first region 511 is connected to the source and drain, and the second region 512 is a channel region; and, the conductor layer 300 may be a light-shielding layer to prevent light irradiating the channel region 512 of the active layer 510 from affecting the performance of the active layer.

The via hole on the display substrate can be manufactured using the method of the present disclosure. For example, the via hole of the buffer layer 700 and the interlayer dielectric layer 800 is manufactured using the method of the present disclosure, and the side of the interlayer dielectric layer 800 away from the buffer layer 700 has an infiltration groove 100a, the interlayer dielectric layer 800 has a first via hole 120a, and the buffer layer 700 has a second via hole 110a. The infiltration groove 100a has a spherical crown shape, and the opening size of the infiltration groove 100a is larger than the opening size of the first via hole 120a at the bottom of the infiltration groove 100a. The first via hole 120a and the second via hole 110a are arranged coaxially; or, the central axis of the infiltration groove 100a is arranged coaxially with the first via hole 120a and the second via hole 110a. The minimum aperture of the first via hole 120a is not less than the maximum aperture of the second via hole 110a. Of course, the aperture of the first via hole 120a may be slightly larger than the aperture of the second via hole 110a. The second conductor layer 400 may be connected to the first conductor layer 300 through the via hole manufactured in the present disclosure.

It is understandable that other via holes on the display substrate can also be manufactured using the method of the present disclosure. For example, the via hole of the interlayer dielectric layer 800 can be manufactured using the method of the present disclosure, and the second conductor layer 400 and the active layer 510 can be connected through the via hole of the interlayer dielectric layer 800.

Based on the same inventive concept, a display panel provided by embodiments of the present disclosure includes: the display substrate provided by any of the foregoing embodiments.

By applying the embodiments of the present disclosure, at least the following beneficial effects can be achieved.

Before the via hole is patterned, the etching solution is used to infiltrate the etching point of the film group 100 to form an infiltration groove 100a at the etching point of the film group 100, which reduces the thickness of the film group 100 that needs to be etched, can accordingly reduce the thickness of the photoresist layer for subsequent patterning, greatly reduces the probability of denaturation of the photoresist layer at the edge of the via hole, reduces the risk of short circuit between layers of the film group 100, improves the etching accuracy, and helps improving the ability to reduce the aperture. In addition, the etching solution only performs infiltration corrosion on the etching point corresponding to the via hole, and most of the remaining film group 100 is not infiltrated, which does not affect the overall electrical characteristics such as capacitance.

A spherical cap-shaped infiltration groove 100a is formed on the surface of the film group 100, and a gentle slope is formed in the via hole formed by subsequent patterning, which forms a favorable morphology for the coating of the photoresist layer and reduces the possibility of photoresist layer residue.

The etching solution uses hydrofluoric acid and micro spraying. Because the amount of hydrofluoric acid is small, it does not have the elution ability, and pitting corrosion is formed on the surface of the film group 100, and this part of the film that has been corroded by hydrofluoric acid is loose. In subsequent patterning, it is easier to be etched than the part of film group 100 that has not been corroded by hydrofluoric acid.

Two dry etchings are implemented, the first film layer 120 is etched to obtain the first via hole 120a, and the second film layer 110 is etched to obtain the second via hole 110a, which reduces the amount of dry etching each time. That is, the thickness of the photoresist layer required for each dry etching is reduced, which can effectively reduce the probability of degeneration of the photoresist layer at the edge of the via hole. Moreover, each dry etching will undergo a stripping process to remove the remaining photoresist layer in time, which can also reduce the probability of denaturation of the photoresist layer at the edge of the via hole and improve the etching accuracy.

The display substrate with the aforementioned via hole structure manufactured by the method provided in this embodiment is compared with the wiring method of deepening small holes in the related art, and the overlapping of the first conductor layer 300 with other subsequent conductive layers (such as the second conductor layer 400) will be easier. On the other hand, the function of the via hole is to electrically connect other subsequent conductive layers with the first conductor layer 300 under the via hole. The via hole of the present solution forms a stepped structure, which makes the slope relatively gentle, which is beneficial to the connection of other conductive layers and the first conductor layer 300 under the via hole, and reduces the risk of disconnection on the sidewall of the via hole.

Those skilled in the art can understand that the steps, measures, and solutions in various operations, methods, processes that have been discussed in this disclosure can be alternated, changed, combined, or deleted. Further, other steps, measures, and solutions in the various operations, methods, and processes that have been discussed in the present disclosure can also be alternated, changed, rearranged, decomposed, combined, or deleted. Further, steps, measures, and solutions in various operations, methods, and processes in the related art which are similar to those disclosed in the present disclosure can also be alternated, changed, rearranged, decomposed, combined, or deleted.

In the description of the present disclosure, it should be understood that the orientations or positional relationships indicated by the terms "center", "upper", "lower", "front", "rear", "left", "right", "vertical", "horizontal", "top", "bottom", "inner", "outer", etc. are based on the orientations or positional relationships shown in the drawings, and are only for the convenience of describing the present disclosure and simplifying the description, rather than indicating or implying the referred device or element must have a specific orientation, be configured and operated in a specific orientation, and therefore cannot be understood as a limitation of the present disclosure.

The terms "first" and "second" are only used for descriptive purposes, and cannot be understood as indicating or implying relative importance or implicitly indicating the number of indicated technical features. Thus, the features defined with "first" and "second" may explicitly or implicitly include one or more of these features. In the description of the present disclosure, unless otherwise specified, "plurality" means two or more.

In the description of the present disclosure, it should be noted that, unless otherwise clearly defined and defined, the terms "installed", "coupled", and "connected" should be understood in a broad sense, for example, it may be a fixed connection or a detachable connection, or an integral connection; it can be directly connected, or indirectly connected through an intermediate medium, and it can be the internal communication between two components. For those of ordinary skill in the art, the specific meaning of the above-mentioned terms in the present disclosure can be understood in specific situations.

In the description of this specification, specific features, structures, materials, or characteristics may be combined in any one or more embodiments or examples in an appropriate manner.

It should be understood that, although the various steps in the flowchart of the drawings are shown in sequence as indicated by the arrows, these steps are not necessarily executed in sequence in the order indicated by the arrows. Unless explicitly stated herein, the execution of these steps is not strictly limited in order, and they can be executed in other orders. Moreover, at least part of the steps in the flowchart of the drawings may include multiple sub-steps or multiple stages. These sub-steps or stages are not necessarily executed at the same time, but can be executed at different times, and the order of execution is also not necessarily performed sequentially, but may be performed in turn or alternately with other steps or at least a part of sub-steps or stages of other steps.

The above are only part of the embodiments of the present disclosure. It should be pointed out that for those of ordinary skill in the art, without departing from the principles of the present disclosure, several improvements and modifications can be made, and these improvements and modifications should be regarded as within the protection scope of the present disclosure.

What is claimed is:

1. A method of manufacturing a display substrate, the method comprising:
   infiltrating an etching point of a film group with an etching solution, to form an infiltration groove at the etching point of the film group; and
   patterning a remaining part of the film group at the infiltration groove, to obtain a via hole penetrating the remaining part of the film group,
   wherein the film group comprises a first film layer and a second film layer which are stacked, and wherein the method comprises:
   infiltrating the etching point of the film group with the etching solution, to form the infiltration groove on a side of the first film layer away from the second film layer; and
   patterning the remaining part of the film group at the infiltration groove, to obtain the via hole penetrating the remaining part of the film group; and wherein patterning the remaining part of the film group at the infiltration groove comprises:
providing a first photoresist layer on the first film layer, and making the first photoresist layer to form a first opening in the infiltration groove, a size of the first opening corresponding to an opening size of a first via hole to be etched at a bottom of the infiltration groove;
implementing a first dry etching, by using the first photoresist layer as a first mask, on the first film layer, to obtain the first via hole penetrating the first film layer;
stripping the remaining first photoresist layer;
providing a second photoresist layer on the first film layer and a portion of the second film layer exposed in the first via hole, and making the second photoresist layer to form a second opening in the first via hole, a size of the second opening corresponding to an opening size of a second via hole to be etched at a side of the second film layer close to the first film layer;
implementing a second dry etching, by using the second photoresist layer as a second mask, on the second film layer, to obtain the second via hole penetrating the second film layer; and
stripping the remaining second photoresist layer.

2. The method of claim 1, wherein infiltrating the etching point of the film group with the etching solution comprises:
fixed-point placing, by using a printing method, the etching solution at the etching point.

3. The method of claim 1, wherein an inner surface of the infiltration groove is a curved surface, and an opening size of the infiltration groove is larger than the opening size of the first via hole patterned at the bottom of the infiltration groove.

4. The method of claim 1, wherein the etching solution comprises: hydrofluoric acid with a concentration of not more than 5%.

5. The method of claim 1, wherein:
an orthographic projection of the first via hole on the display substrate and an orthographic projection of the second via hole on the display substrate overlap each other; or
an orthographic projection of the infiltration groove on the display substrate and an orthographic projection of the first via hole on the display substrate overlap each other.

6. The method of claim 5, wherein:
the orthographic projection of the first via hole on the display substrate covers the orthographic projection of the second via hole on the display substrate; or
the orthographic projection of the infiltration groove on the display substrate covers the orthographic projection of the first via hole on the display substrate.

7. A display substrate manufactured according to the method of claim 1, the display substrate comprising:
the film group;
the infiltration groove provided on a first side of the film group; and
the via hole provided at the infiltration groove of the film group, wherein the via hole penetrates the film group, a first end opening of the via hole is located at the bottom of the infiltration groove, and a second end opening of the via hole is located at a second side of the film group away from the infiltration groove.

8. The display substrate of claim 7, wherein the display substrate further comprises a first conductor layer located at the second side of the film group away from the infiltration groove, and a second conductor layer located at the first side of the film group close to the infiltration groove, the first conductor layer and the second conductor layer being connected through the via hole.

9. The display substrate of claim 8, wherein:
the via hole comprises the first via hole and the second via hole that are communicated with each other;
the infiltration groove is located on the side of the first film layer away from the second film layer, and the first via hole is located at the infiltration groove and penetrates the first film layer along a direction of the bottom of the infiltration groove towards the second film layer; and
the second film layer has the second via hole, and the second via hole penetrates the second film layer.
the infiltration groove is located on a side of the first film layer away from the second film layer, and the first via hole is located at the infiltration groove and penetrates the first film layer along a direction of the bottom of the infiltration groove towards the second film layer; and
the second film layer has the second via hole, and the second via hole penetrates the second film layer.

10. The display substrate of claim 9, wherein:
an orthographic projection of the first via hole on the display substrate and an orthographic projection of the second via hole on the display substrate overlap each other; or
an orthographic projection of the infiltration groove on the display substrate and an orthographic projection of the first via hole on the display substrate overlap each other.

11. The display substrate of claim 10, wherein:
the orthographic projection of the first via hole on the display substrate covers the orthographic projection of the second via hole on the display substrate; or
the orthographic projection of the infiltration groove on the display substrate covers the orthographic projection of the first via hole on the display substrate.

12. The display substrate of claim 9, wherein:
an inner surface of the infiltration groove is a curved surface, and an opening size of the infiltration groove is greater than the opening size of the first via hole at the bottom of the infiltration groove.

13. The display substrate of claim 9, wherein the second film layer is a buffer layer, and the first film layer is an isolation layer.

14. A display panel, comprising: the display substrate of claim 7.

* * * * *

UNITED STATES PATENT AND TRADEMARK OFFICE
CERTIFICATE OF CORRECTION

PATENT NO. : 11,631,705 B2
APPLICATION NO. : 17/028988
DATED : April 18, 2023
INVENTOR(S) : Hongda Sun and Wenjun Hou It is certified that error appears in the above-identified patent and that said Letters Patent is hereby corrected as shown below:

In the Claims

Column 16, Lines 26-32 Claim 9:
Delete "the infiltration groove is located on a side of the first film layer away from the second film layer, and the first via hole is located at the infiltration groove and penetrates the first film layer along a direction of the bottom of the infiltration groove towards the second film layer; and the second film layer has the second via hole, and the second via hole penetrates the second film layer."

Signed and Sealed this
Twenty-ninth Day of August, 2023

Katherine Kelly Vidal
*Director of the United States Patent and Trademark Office*